United States Patent
Britton et al.

(10) Patent No.: US 6,483,342 B2
(45) Date of Patent: Nov. 19, 2002

(54) MULTI-MASTER MULTI-SLAVE SYSTEM BUS IN A FIELD PROGRAMMABLE GATE ARRAY (FPGA)

(75) Inventors: Barry K. Britton, Orefield, PA (US); Ravikumar Charath, Allentown, PA (US); Zheng Chen, Macungie, PA (US); James F. Hoff, Bethlehem, PA (US); Cort D. Lansenderfer, N. Catasauqua, PA (US); Don McCarley, Austin, TX (US); Richard G. Stuby, Jr., New Tripoli, PA (US); Ju-Yuan D. Yang, Macungie, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/864,277

(22) Filed: May 25, 2001

(65) Prior Publication Data

US 2002/0008540 A1 Jan. 24, 2002

Related U.S. Application Data

(60) Provisional application No. 60/207,371, filed on May 26, 2000.

(51) Int. Cl.$^7$ ............................................. H03K 19/177
(52) U.S. Cl. ........................................ 326/39; 326/37
(58) Field of Search ..................................... 326/37–41

(56) References Cited

U.S. PATENT DOCUMENTS

| 6,034,542 A | * | 3/2000 | Ridgewy ..................... 326/41 |
| 6,094,065 A | * | 7/2000 | Tavana et al. ................. 36/41 |
| RE37,195 E | * | 5/2001 | Kean ........................... 326/41 |

* cited by examiner

Primary Examiner—Don Phu Le

(57) ABSTRACT

An embedded system bus is woven between a plurality of embedded master elements and at least one slave element within the FPGA device, and provides an external processor interface allowing direct access to any of the plurality of embedded slave elements. Using the embedded system bus, any of a plurality of masters may be allowed to program an embedded element, e.g., embedded FPGA logic, whereas conventional FPGAs allowed only a single master (e.g., a processor) to program the embedded FPGA logic. The embedded system bus is a group of signals, typically data, address and control, that connects system elements together and provides a basic protocol for the flow of data. The embedded system bus allows for control, configuration and status determination of the FPGA device. The embedded system bus is preferably a dedicated function available at all times for arbitrated access to allow communication between the various embedded system components.

13 Claims, 4 Drawing Sheets

CONFIGURATION BIT STREAM

MULTI-MASTER MULTI-SLAVE SYSTEM BUS IN A FIELD PROGRAMMABLE GATE ARRAY (FPGA)

This application claims priority from U.S. Provisional Application No. 60/207,371 entitled "Novel Field Programmable Gate Array" filed on May 26, 2000, the specification of which is hereby expressly incorporated herein by reference.

BACKGROUND OF THE INVENTION

1. Field of the Invention

This invention relates generally to field programmable gate arrays (FPGAs). In particular, it relates to the implementation of improved architectures and functions within an FPGA.

2. Background of Related Art

A Field Programmable Gate Array (FPGA) is a programmable integrated circuit which provides a customized logic array and functionality to a particular customer.

FIG. 4 depicts a conventional Field Programmable Gate Array (FPGA).

In particular, as shown in FIG. 4, an FPGA 400 typically includes four distinct features: configuration memory 406, input/output (I/O) blocks 408–414, configurable logic blocks 404, and a routing network 402 between the internal components.

Configuration memory 406 provides access between the elements of the FPGA 400 and one external controlling device (e.g., a programmer). Based on the contents of the configuration memory 406, various logical functions of the configurable logic blocks 404 are enabled and wired together via a configuration of the routing network 402. Similarly, certain logic blocks are provided I/O access through various types of I/O devices 408–414, as determined by both the configuration memory 406 and the routing provided by the routing network 402.

The configuration memory 406 may be, e.g., static RAM (SRAM). The configuration memory bits turn elements or switches on or off in embedded elements of the configurable logic blocks 404, and establish routing between elements of the FPGA 400, to define the functionality of the FPGA 400.

Typically, individual memory bits of the configuration memory 406 define the desired functionality of the FPGA device 400. These configuration memory bits are conventionally loaded one at a time using data lines and address lines directly to the configuration memory 406 (e.g., SRAM) over an external bus 420 from an external source. All embedded elements are programmed similarly using the same format to the configuration memory 406.

Other types of configuration memory 406 typically include, e.g., EPROM or EEPROM, anti-fused, fused, or other storage devices, providing either one-time programmability, or multiple reprogrammability. The configuration memory 406 may be formed of one or more types of memory (e.g., SRAM and EEPROM).

The I/O blocks 408–414 conventionally provide direct connection between an internal, embedded component of the FPGA 400, and external devices. The I/O blocks 408–414 may be hard-wired and/or configured and routed based on the user-instructed configuration stored in the configuration memory 406.

The configuration memory 406 is loaded, or programmed, before use of the FPGA 400. Before the FPGA 400 is configured, no external devices other than the single programming device connected to the external access bus 420 are permitted to communicate with embedded elements of the FPGA 400 (e.g., with the configurable logic blocks 404).

The routing network 402 is programmably defined by the configuration memory 406 to route signaling between the internal logic blocks of the FPGA. The routing network 402 carries signal traffic between the various internal, embedded components of the FPGA 400. Some portions of the routing network 402 may be directly connected or hard wired and/or may not be fully programmable by the user.

FPGA devices often include embedded run-time memory 450 in addition to the configuration memory 406. The embedded run-time memory 450 is accessible until configuration of the FPGA 400 is complete. Moreover, the configuration memory 406 is generally not reprogrammed while the FPGA device 400 is in operation.

FPGA devices 400 are typically programmed using an appropriate configuration and routing software application which inputs a user's particular requirements, and determines a best configuration of the 15 routing of the FPGA 400 by steps generally referred to as "partitioning", "placing", and "routing", to ultimately configure the elements of the FPGA 400 to meet the particular user's needs.

FPSCs, a more recent derivation of an FPGA, combines field programmable logic with ASIC or mask programmed logic into a single device. FPSCs provide the quick time to market and flexibility inherent in FPGAs, the design effort savings inherent from the use of software driven cores, as well as the speed, design density, and economy inherent in application specific integrated circuits (ASICs).

Embedded cores within an FPSC can take many forms. Generally, the embedded cores available within an FPSC are selected from an ASIC library, but customer specific FPSCs may be developed to include one or more custom, proprietary or otherwise unique embedded core supplied by the user.

In conventional devices, pre-programming of application specific blocks (ASB blocks) and configuration memory was performed through configuration logic. However, conventional FPGA configuration logic is not available for access or use by FPGA components after configuration, leading to inefficient and slow implementations. Moreover, as shown in FIG. 4, the functionality of the FPGA 400 or FPSC is conventionally programmed by only one master device (e.g., a microprocessor) having direct access to the configuration memory 406 of the device, and reconfiguration during use if not permitted.

There is thus a need for a more flexible FPGA device, allowing efficient and faster implementations, and greater access.

SUMMARY OF THE INVENTION

In accordance with the principles of the present invention, a Field Programmable Gate Array comprises a plurality of master and/or slave elements, and an embedded system bus between the plurality of master and slave elements. An external interface provides external access to the embedded system bus from a device external to the Field Programmable Gate Array.

A method of providing external access to any one of a plurality of master and/or slave elements in a Field Programmable Gate Array in accordance with another aspect of the present invention comprises providing an embedded system bus between a plurality of master and/or slave elements. An external interface is provided on the system bus. The external interface provides access between the embedded system bus and a device external to the Field Programmable Gate Array. The external interface is another master element. All accesses are available on the system bus independent of the state of the FPGA configuration.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Conventional Field Programmable Gate Array (FPGA) devices provide external access to a single internal (i.e., embedded) element, i.e., the configuration memory. Conventional FPGA devices do not include an embedded system bus providing data, address and control between the external device and any embedded element other than the configuration memory.

In the disclosed embodiment, a SRAM based FPGA includes a hierarchical architecture of logic, clocks, routing, RAM, and system-level blocks creating a seamless merge of FPGA and ASIC designs.

The FPGA architecture comprises four basic elements: programmable logic cells (PLCs), programmable I/O cells (PIOs), embedded block RAMs (EBRs), and system-level features, interconnected with both global and local wires.

An array of PLCs are surrounded by common interface blocks which provide an abundant interface to the adjacent PLCs or system blocks. Each PLC may contain, e.g., a PFU, a SLIC, local routing resources, and configuration RAM.

Most of the FPGA logic may be performed in the PFU, but decoders, PAL-like functions, and tri-state buffering can be performed in the SLIC. The PIOs provide device inputs and outputs and can be used to register signals and to perform input demultiplexing, output multiplexing, uplink and downlink functions, and other functions on two output signals.

The present invention weaves an embedded system bus between a plurality of embedded master and/or slave elements within the FPGA device, and provides an external processor interface allowing direct access to any of the plurality of embedded elements. Access to these elements is available regardless of the state of configuration memory.

Master elements are those that control the embedded system bus, while slave elements cannot control the bus.

The embedded multi-master multi-slave system bus connects together various on-chip system elements in a FPGA to increase their efficiency, usefulness and speed. Using the embedded multi-master multi-slave system bus, any of a plurality of masters may be allowed to program and embedded slave element, e.g., embedded block RAM (EBR) either during configuration or during normal operation, whereas conventional FPGAs allowed only a single master (e.g., a processor) to program the configuration memory during configuration.

An embedded multi-master system multi-slave bus is a group of signals, typically data, address and control, that connects system elements together and provides a basic protocol for the flow of data. The embedded multi-master multi-slave system bus allows for control, configuration and status determination of the FPGA device. The embedded multi-master multi-slave system bus is preferably a dedicated function available at all times for arbitrated access to allow communication between the various embedded system components.

Figure 1:
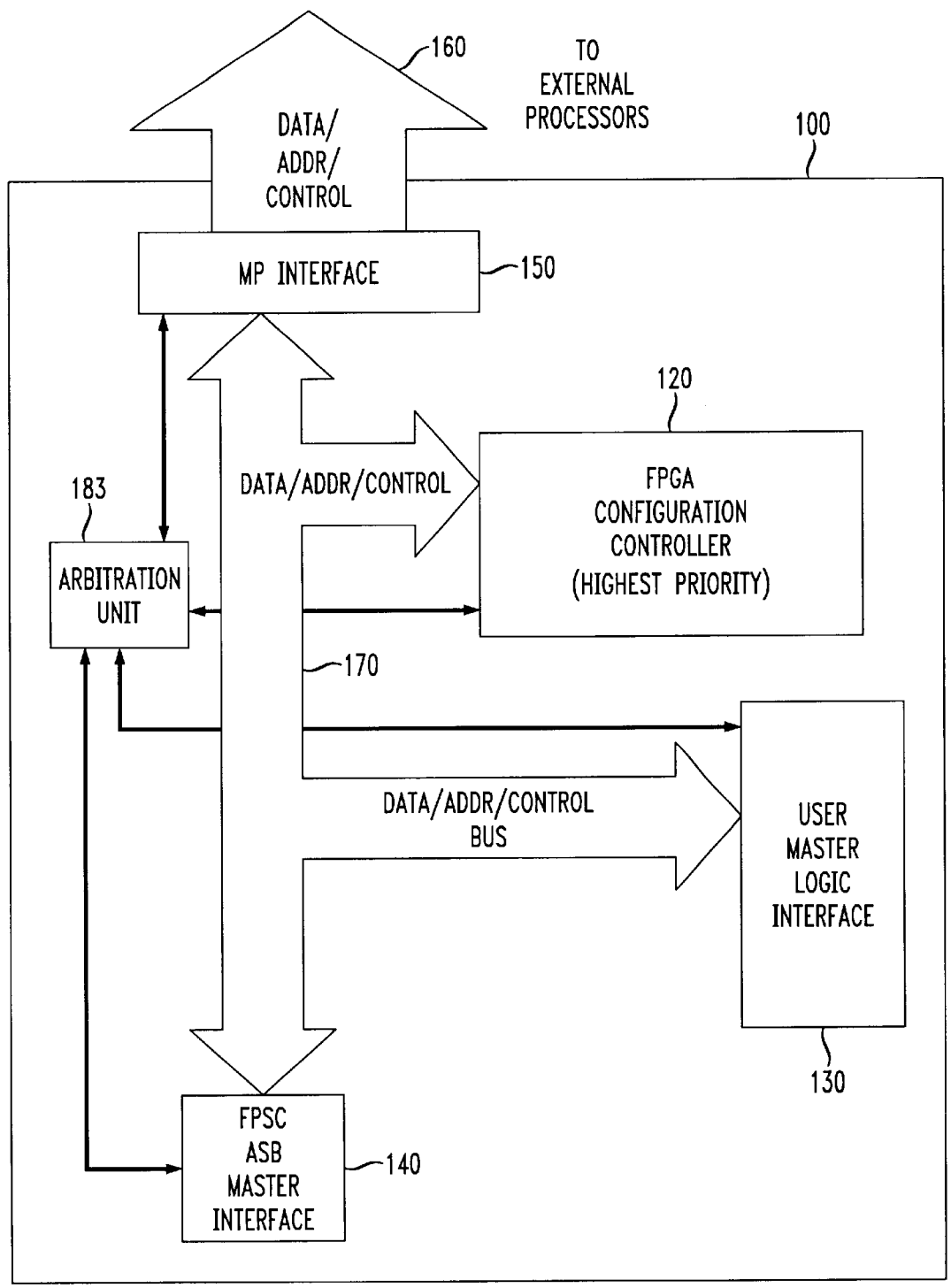
FIG. 1 shows a multi-master Field Programmable Gate Array (FPGA), in accordance with the principles of the present invention.
Figure 2:
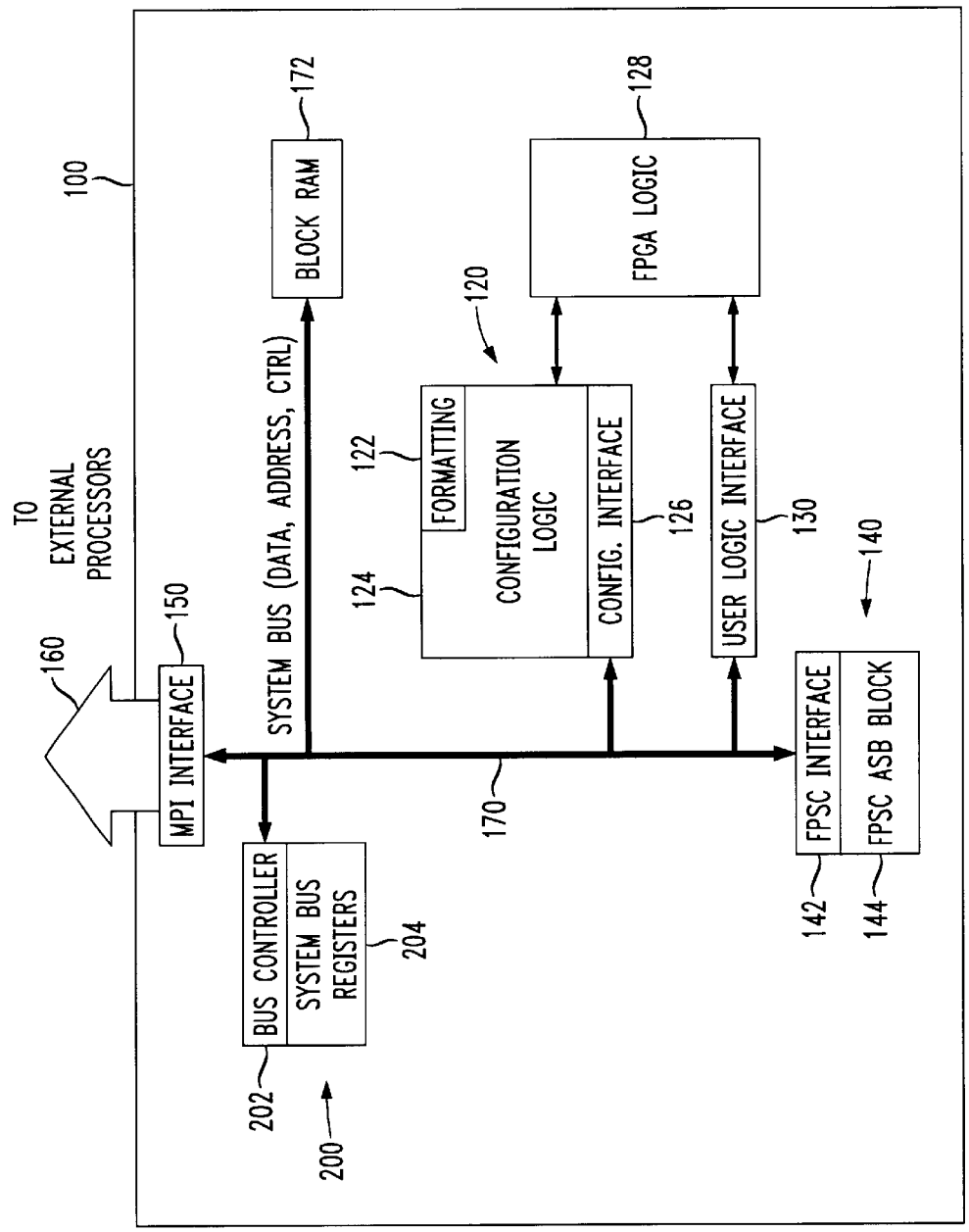
FIG. 2 is a more detailed depiction of a multi-master FPGA, in accordance with the principles of the present invention.

FIG. 1 shows a multi-master multi-slave Field Programmable Gate Array (FPGA), and FIG. 2 is a more detailed depiction of a multi-master multi-slave FPGA, in accordance with the principles of the present invention.

In particular, FIGS. 1 and 2 show an embedded multi-master multi-slave system bus 170 allowing direct external access to embedded elements (e.g., an FPGA configuration controller 120, a user master/slave logic interface 130, and/or an FPSC master/slave interface 140). Moreover, importantly, an external microprocessor interface (MPI) 150 is provided between the embedded multi-master multi-slave system bus 170 and one or more external processors.

The on-chip, embedded multi-master multi-slave system bus 170 may be, e.g., an 8-bit system bus, with 1-bit parity, to facilitate communication among the MPI 150, configuration logic 120, FPGA control 202, status registers 204, embedded block RAM 172, and/or user defined logic 128. Of course, the multi-master multi-slave system bus 170 may be of a different width, e.g., 16-bit or 32-bit width. The disclosed embedded multi-master multi-slave system bus uses the AMBA specification, Rev. 2.0 AHB protocol, but of course other bus protocols are possible and envisioned within the scope of the present invention.

Bus clock generation can be sourced from an MPI clock, configuration clock (for slave configuration modes), internal oscillator, user clock from routing, FPSC ASB clock, or from a port clock (e.g., for JTAG configuration modes).

Embedded system bus control registers 204 and bus controller 202 provide control to the FPGA device 100, e.g., signaling for reprogramming, reset functions, and PLL programming. Status registers monitor, e.g., INIT, DONE, and system bus errors.

An interrupt controller may be integrated into bus controller 202 to provide, e.g., up to eight possible interrupt resources.

The MPI 150 permits direct access between, e.g., an external microprocessor bus 160 and any of a plurality of embedded master elements.

The MPI 150 provides system level functionality, together with the embedded system bus 170 and embedded slave elements, e.g., EBR 172, bus register 204, and user slave logic 130. The MPI 150 provides a glueless interface between the FPGA device 100 and external processors (e.g., microprocessors, microcontrollers, digital signal processors (DSPs), etc.) The MPI 150 can be used for configuration, programming and readback, as well as for FPGA control and monitoring of FPGA status. MPI transactions utilize the embedded system bus 170, which may operate at, e.g., 66 MHz performance levels.

The MPI 150 provides a system-level microprocessor interface to the FPGA user-defined logic 128 following configuration through the embedded system bus 170, including access to the embedded block RAM 172 and general user logic 128. Preferably, the MPI 150 supports burst data read and write transfers, allowing short, uneven transmission of data through the interface by including data FIFOs.

The embedded elements on the embedded system bus 170 may be thought of as master or slave devices, a master being in control of the traffic on the embedded system bus and a slave being a respondent to a request from the master. In the given embodiments, the configuration controller 120 is designated as a master device, and has the highest priority with respect to other master elements in arbitration for access to the embedded system bus 170.

Examples of embedded master elements on the embedded system bus (besides the MPI 150) may include, e.g., a user logic interface to user defined embedded FPGA master logic 128, a configuration interface 126 to FPGA configuration logic 124, and/or optionally an FPSC Interface 142 providing access to an FPSC embedded ASIC core (ASB) 140.

Examples of slave elements may include, e.g., the FPSC embedded ASIC core (ASB) 140, the EBR blocks 172, system status and control registers 204, and/or user-defined FPGA slave logic 128. The embedded system bus 170 also contains a bus controller 202 which performs arbitration among masters and process interrupts.

In practical implementation, the embedded system bus 170 may be a true bi-directional bus, or simply a set of point-to-point interconnects that function in a similar fashion to allow direct access from an external processor to an embedded element of the FPGA.

The arbitration unit 183 may implement any suitable arbitration for use of the embedded system bus 170, providing that the configuration controller 120 be preferably given the highest priority of all requesting embedded master elements.

The arbitration unit 183 receives a memory request signal as appropriate from each of the plurality of masters 150, 120, 130, 140, and selects a winning master's address/data/control signals for control of the embedded system bus 170. A winning master is a master which has requested control of the embedded system bus 170 and which is granted that request. In the event that more than one master 150, 120, 130, 140 requests access to the embedded system bus 170 at the same time, the arbitration unit 183 determines the winning master based on appropriately predetermined rules (e.g., round robin). Upon completion of arbitration by the arbitration unit 183, the winning master is informed of its bus ownership via an acknowledge signal.

Preferably, each master on the embedded system bus 170 (other than the configuration controller 120) is configurable to have a user-defined priority. These user-defined priorities may be equal (by default) or different. Among equal priority master elements, the arbitration unit 183 may implement a round robin arbitration among equal priority master elements. Among different priority master elements, the arbitration unit 183 may grant first to the higher priority master device among those requesting masters. The last master element requesting master will become the default master (i.e., retains ownership of the embedded system bus) until the next bus access request is received by the arbitration unit 183.

Configurable priority among the master elements may be set after configuration of the FPGA 100. Before and during initial configuration of the FPGA, the configuration controller 120 captures the embedded system bus 170, and the remaining master devices are given a lower priority. At this point, the remaining master devices may be given the same priority, though this is rather inconsequential because before and during configuration only the configuration controller 120 is given control of the embedded system bus 170, and the remaining master devices are not permitted to access the embedded system bus 170.

For Field Programmable System Chips (FPSCs), the embedded system bus 170 may be extended to also connect to one or more application specific block (ASB) core(s) 140, thus enabling the ASB block 140 to access other system elements in the programmable array, and vice versa.

The externally accessible, embedded system bus 170 allows configuration, control and status of the FPGA device 100 to be obtained from either an external processor(s) via the MPI 150, or by the ASB 140 before or after FPGA configuration, as well as the ability to load configuration data, ASB options and EBR contents. The same embedded system bus 170 may then be used to permit master elements (including an external device or devices via the MPI 150) to access embedded slave elements after configuration.

The EBR may be multi-port RAM, e.g., quad-port RAM blocks embedded in the FPGA core to increase the amount of memory and to complement distributed PFU memory. In the disclosed embodiment, 512×18 quad-port RAM blocks are implemented.

The quad-port Embedded Block RAMs (EBRs) 172 may include two write ports, two read ports, and two byte lane enable signals to provide four port operation.

Large blocks of quad-port RAM may be implemented in the FPGA, e.g., 512×18, to complement the existing distributed PFU memory. Preferably, the RAM 172 has at least four ports, and is configurable as RAM, ROM, a FIFO, a multiplier, and/or CAM.

Arbitration may be optionally provided between the two write ports, as well as direct connection to the high-speed embedded system bus.

Additional logic may be included with the EBRs 172 to allow flexibility to form, e.g., the function of a FIFO, of a constant multiply, or two-variable multiplier. Preferably, the EBRs 172 are user configurable to have a depth, e.g., of 512 k, 256 k, 1 k, etc. Also, the EBRs 172 are preferably programmable to an asynchronous or synchronous mode, and include programmable status and error flags. The EBRs 172 may be preloaded at device configuration time.

The configuration logic 120 allows for initialization of configuration memory 120, embedded block RAM 172 and FPSC memory 144, as well as system bus options and bit stream error checking.

The functionality of the FPGA 100 is determined by internal (i.e., embedded) configuration memory 120. The configuration memory 120 may be loaded using one of several configuration modes. For instance, the FPGA 100 may include internal initialization and configuration circuitry to load configuration data, e.g., at power-up or under system control. FPGA configuration data can reside externally, e.g., in EEPROM or any other type storage media during power down.

In the disclosed embodiment, a link is provided between the embedded FPSC block 140 and the embedded multi-master 32-bit system bus 170 in the FPGA logic 128. The embedded system bus 170 allows the core easy access to many of the FPGA logic functions including embedded block RAM 172 and the microprocessor interface 150.

Clock spines pass across the FPGA/embedded core boundary to allow for fast, low skew clocking between the FPGA and the embedded core. Particular signals (e.g., DONE and global SET/RESET) may be made available to the embedded core, making it possible to fully integrate the embedded core with the FPGA as a system.

Multiple embedded core configurations may be designed into a single device with user programmable control over which configurations are implemented, as well as the capability to change core functionality simply by reconfiguring the device.

The FPGA device 100 includes programmable I/O pads (PIO). The programmable I/O pads may be interfaced through common interface blocks to the FPGA logic array 128. Each common interface block interfaces to one PIO block, e.g., four programmable I/O pads.

The PIO may be split into two pairs of I/O pads, with each pair having independent clock enables, local set/reset, and global set/reset.

On the input side, each PIO may contain a programmable latch/flip-flop to enable very fast latching of data from any pad. On the output side of each PIO, an output from the PLC array can be routed to each output flip-flop, and logic can be associated with each I/O pad.

Use of a multi-master embedded system bus provides a dedicated framework that allows for future expansion of architectures. Furthermore, setup registers are implemented instead of RAM cells to control system bus access the various master blocks (i.e., intellectual property (IP) blocks). Moreover, modifications of register values in the setup registers may be made to setup registers during normal operation. Moreover, use of an internal multi-master system bus allows large amounts of data to be transferred between embedded master and slave elements, e.g., between an ASB block and other embedded or external (i.e., off-chip) system elements.

Configuration via the multi-master multi-slave embedded system bus simplifies configuration by making it similar to any other operation performed on the bus, e.g., by a host processor or an embedded core. The multi-master multi-slave system bus provides an FPGA configuration path from the external microprocessor (MPI) interface 150 to the FPGA core. This direct addressing ability between external devices and embedded master/slave elements in the FPGA device 100 offers maximum flexibility for configuration.

Conventional embedded FPSC devices were configured (or programmed) through FPGA configuration memory bits using the same format as the FPGA. However, conventional bit stream formats did not provide support for EBR initialization, and did not offer flexibility for FPSC memory initialization. There is also less flexibility for FPGA configuration and partial configurations in older format techniques.

However, using the externally accessible embedded system bus 170 in accordance with the principles of the present invention, any of the configurable memories, e.g., configuration RAM, EBR, and FPSC memory may be individually programmed, in any desirable order, and in any desirable or required format with respect to each memory element. Preferably, each memory element may be programmed using a different protocol than the other memory elements.

To accomplish the individual programmability, the disclosed FPGA device 100 implements a new bit stream format that is capable of supporting flexible configurations to the FPGA logic 128, the embedded RAM blocks 172, and/or the Field Programmable System Chip (FPSC) 140. In accordance with the present invention, it is possible to mix these format types in any sequence. Ordering of the bit stream format is selectable by the user.

A configuration or programming bit stream format in accordance with the principles of the present invention allows flexibility to the user in configuring FPGA logic, initializing embedded RAM blocks, and/or configuring embedded FPSC memory.

In conventional FPGA devices, a configuration bit stream could be loaded into an FPGA device in one of two modes, auto-increment or explicit. In auto-increment mode, there is no address frame, and the bit stream sends data frames to different addresses in sequence. In explicit mode, each data frame in the bit stream is followed by an address frame, or a group of address frames, which specify the address for the data. These modes could not be mixed.

In any event, conventional bit streams were directed only to configuration memory accessible from an external device. No provision was made to directly program multiple embedded slave elements, much less provide for different programming protocols for separate slave elements embedded in the same FPGA device.

In accordance with the principles of the present invention, each of a plurality of embedded slave elements may be programmed directly from an external device through configuration controller 120 using a bit stream format.

In particular, in accordance with another aspect of the present invention, the configuration bit stream may contain multiple (e.g., three) different types of bit stream formats, one particularly suited for each embedded slave element or configuration memory. This is particularly advantageous in devices using customer supplied embedded elements, which may or may not follow a particular configuration protocol followed by other embedded elements of the device.

One type of bit stream may be suited for configuring a generic FPGA configuration memory, another one for initializing embedded block RAM, while yet another bit stream may be utilized for initializing an embedded FPSC core memory element.

In accordance with the principles of the present invention, the individual memory elements may be programmed in any particular order or sequence as desired by the user of the FPGA device. Thus, a configuration bit stream can have FPGA, RAM and/or FPSC portions in any particular order or sequence. Moreover, some memory elements may be configured or otherwise programmed with multiple bit streams, while others might be configured with a single bit stream.

It is preferable that the particular type of bit stream be identified in the bit stream (i.e., for which embedded element a particular bit stream is intended). In the given embodiments, a mandatory header is utilized, as is a postamble, for each type of memory element.

Figure 3:
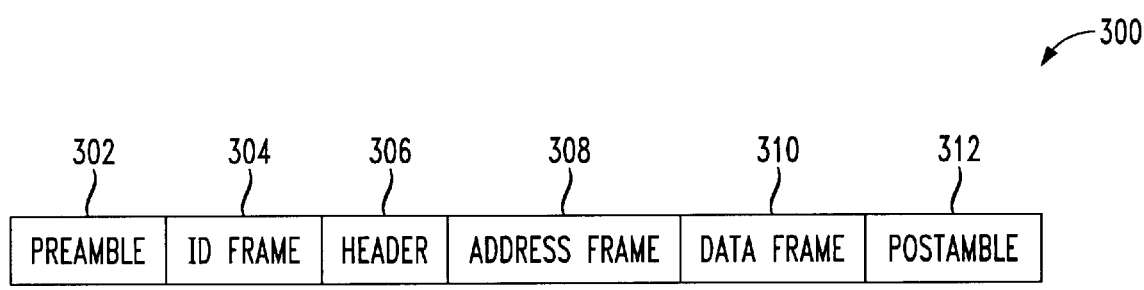
FIG. 3 shows an exemplary bit stream, in accordance with the principles of the present invention.
Figure 4:
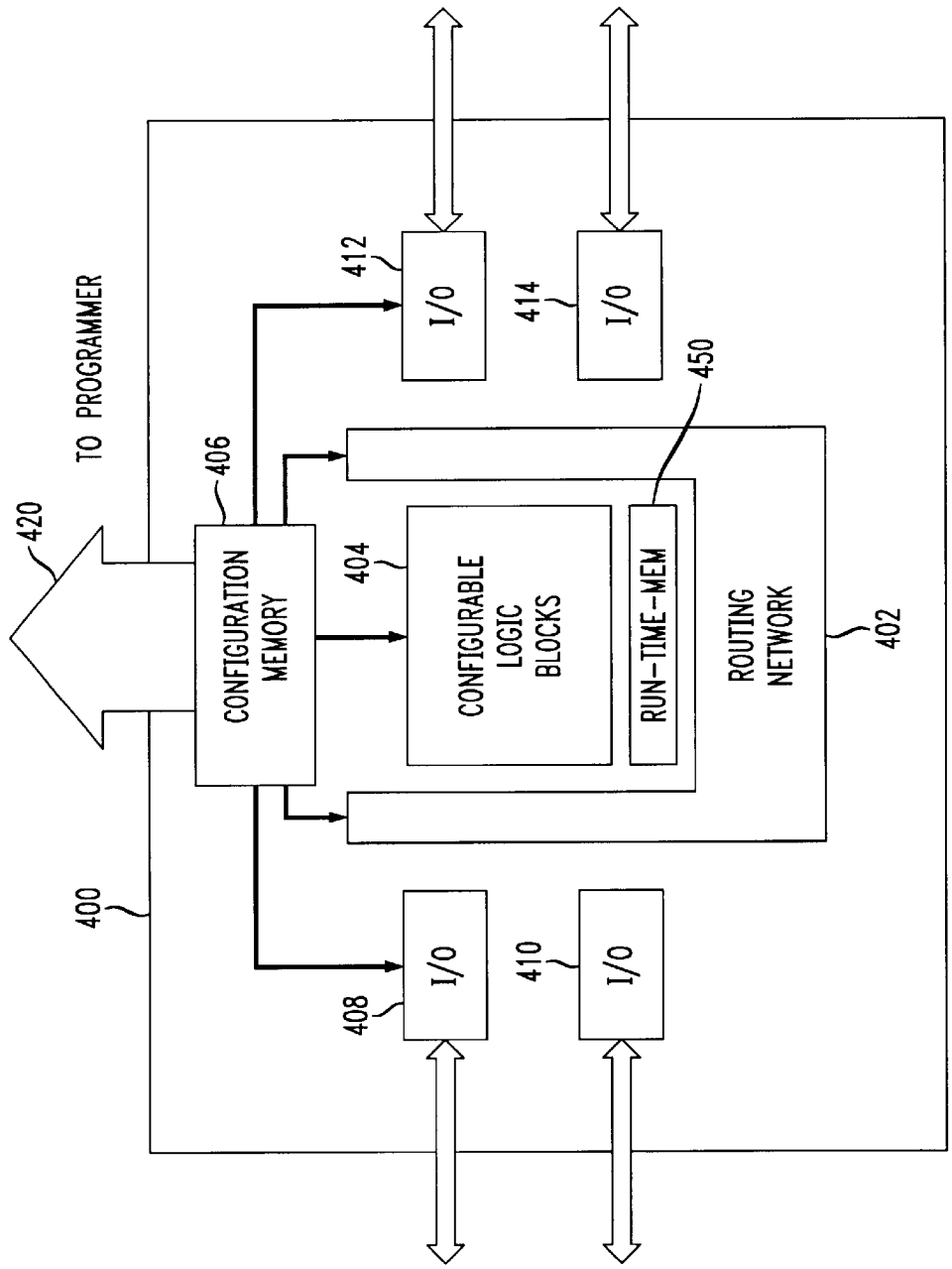
FIG. 4 shows a conventional Field Programmable Gate Array (FPGA).

FIG. 3 shows an exemplary bit stream, in accordance with the principles of the present invention.

In particular, as shown in FIG. 3, an exemplary bit stream 300 input through the configuration controller 120 to the embedded system bus 170 to configure any/all slave elements and configuration memory includes a preamble 302, an ID frame 304, a header 306, an address frame 308, a data frame 310, and a postamble 312.

The preamble 302 identifies 32 or 24 bit count.

The ID frame determines if the particular bit stream being input to the embedded system bus 170 is correct for a device type in the FPGA device 100.

The header 306 identifies the type of bit stream format (i.e., FPGA, FPSC, RAM).

The address frame 308 identifies the starting address for the included data, and the length of the data frame. In the exemplary embodiment, the address frame 308 begins with "00".

The data frame 310 contains the configuration data relevant to the particular embedded master element in the FPGA device 100. In the exemplary embodiment, the data frame 310 begins with "01".

The postamble 312 identifies what configuration data will follow in the next bit stream, e.g., if there will be another bit stream containing additional configuration data, or whether the input of configuration data is complete. In the exemplary embodiment, a postamble 312 beginning with a "0" indicates that additional data will be sent in a subsequent bit stream, while a postamble beginning with a "00" indicates the completion of the input of configuration data.

In the disclosed embodiment, three exemplary memory types are configured using the multi-slave bit stream format in accordance with the principles of the present invention. In particular, the three types are 'generic' FPGA configuration memory, embedded block RAM, and FPSC memory.

When configuring or programming embedded FPGA logic in an embedded multi-master multi-slave FPGA, the header 306 of the bit stream 300 is loaded with a unique header that identifies the bit stream as being directed toward generic FPGA logic. In the given embodiment, an address frame to the FPGA logic is preferably sent before a data frame, making it possible to implement and mix auto-increment and explicit modes.

If more than one data frame follows a single address frame, then the data frames will be sent to subsequent addressees in the address frame. The address frame may be optional for use in configuring FPGA logic, e.g., an auto-increment mode may be utilized to load configuration data into the FPGA logic.

When initializing RAM in an embedded multi-master FPGA, the header 306 of the bit stream 300 is loaded with a unique header that identifies the bit stream as being directed toward embedded block RAM.

In the given embodiment, a number of fixed-size embedded RAM blocks are provided. Each RAM block in the FPGA 100 is given memory locations within a memory map.

The configuration address frame of the multi-master bit stream may contain the length of the data frame. In this way, the size of the RAM blocks may be fixed or variable.

Preferably, each data frame contains all the bits for a particular block or RAM. An auto-increment mode may be implemented wherein the address frame is not necessary, and thus the data frame(s) in the bit stream(s) will automatically be written into RAM blocks of the same size, in sequence.

An address frame may be used before each data frame, or before a group of data frames, allowing for random ordering of the initialization of the multiple embedded RAM blocks.

To initialize FPSC memory, the multi-master bit stream includes a unique header, address frames, data frames, and postamble.

When initializing the FPSC, the address frame may contain both a leading address for the data, as well as the length of the data that follows. This allows variation in the length of the data frame among various memory locations embedded in the FPGA device 100, allowing for variation for different FPSCs or for different addresses.

When initializing an FPSC memory, a leading address frame must be sent before the first data frame. An address frame can be used for a group of data frames that all have the same length. If a data frame with a different length is used a new address frame will be sent to identify the new length. Thus, a multi-slave bit stream allows for configuration using data in any of a variety of lengths.

The multi-slave bit stream format in accordance with the principles of the present invention offers increased flexibility in the configuration and/or partial reconfiguration of embedded memory elements, increased speed, reduced integrated circuit size, increased FPGA design flexibility, easier designer integration and faster time-to-market for end-user products.

Use of a multi-slave bit stream format in accordance with the principles of the present invention allows for an open system despite the possibility of having closed system elements embedded within the FPGA.

While the invention has been described with reference to the exemplary embodiments thereof, those skilled in the art will be able to make various modifications to the described embodiments of the invention without departing from the true spirit and scope of the invention.

What is claimed is:

1. A Field Programmable Gate Array, comprising:

a plurality of master/slave elements, wherein at least one said elements is an FPGA configuration controller;

an embedded system bus between said plurality of master/slave elements; and an external configuration interface providing external access to said embedded system bus from a device external to said Field Programmable Gate Array.

2. The Field Programmable Gate Array according to claim 1, wherein:

said plurality of master/slave elements includes at least one master element and at least one slave element.

3. The Field Programmable Gate Array according to claim 1, wherein:

said external configuration interface has a higher priority to access said embedded system bus than any of said plurality of master/slave elements.

4. The Field Programmable Gate Array according to claim 1, wherein:

a priority of each of said plurality of master/slave elements is programmable by a user of said Field Programmable Gate Array.

5. The Field Programmable Gate Array according to claim 1, further comprising:

an arbitration unit to arbitrate among said plurality of master/slave elements and said external interface for access to said embedded system bus.

6. The Field Programmable Gate Array according to claim 1, wherein:

at least one of said plurality of master/slave elements is an FPSC ASB interface.

7. The Field Programmable Gate Array according to claim 1, wherein:

one of said plurality of master/slave elements is a RAM.

8. A Field Programmable Gate Array, comprising:

a plurality of master/slave elements, wherein at least one of said elements is a RAM, wherein said RAM is configurable as at least one of a ROM, a FIFO, a multiplier, and a CAM;

an embedded system bus between said plurality of master/slave elements; and an external configuration interface providing external access to said embedded system bus from a device external to said Field Programmable Gate Array.

9. A Field Programmable Gate Array, comprising:

a plurality of master/slave elements, wherein at least one said elements is a RAM, said RAM having at least four ports, of which a read port and a write port are used to connect to said embedded system bus, and remaining ones of said at least four ports connect to programmable routing;

an embedded system bus between said plurality of master/slave elements; and an external configuration interface providing external access to said embedded system bus from a device external to said Field Programmable Gate Array.

10. A method of providing external access to any one of a plurality of master/slave elements in a Field Programmable Gate Array, comprising:

providing an embedded system bus between a plurality of master/slave elements, wherein at least one of said master/slave elements is an FPGA configuration controller; and providing an external configuration interface on said system bus, said external configuration interface providing access between said embedded system bus and a device external to said Field Programmable Gate Array, and said external configuration interface being a master element.

11. The method of providing external access to any one of a plurality of master/slave elements in a Field Programmable Gate Array according to claim 10, further comprising:

arbitrating access to said embedded system bus among said plurality of master/slave elements and said master element.

12. Apparatus for providing external access to any one of a plurality of master/slave elements in a Field Programmable Gate Array, comprising:

means for providing an embedded system bus between said plurality of master/slave elements, wherein at least one of said master/slave elements is an FPGA configuration controller; and means for providing an external configuration interface on said system bus, said external configuration interface providing access between said embedded system bus and a device external to said Field Programmable Gate Array, and said external configuration interface being a master element.

13. The apparatus for providing external access to any one of a plurality of master/slave elements in a Field Programmable Gate Array according to claim 12, further comprising:

means for arbitrating access to said embedded system bus among said plurality of master/slave elements and said master element.

* * * * *